United States Patent [19]

Kozuka et al.

[11] Patent Number: 5,111,135

[45] Date of Patent: May 5, 1992

[54] METHOD FOR OPTICALLY MEASURING ELECTRIC FIELD AND OPTICAL VOLTAGE/ELECTRIC-FIELD SENSOR

[75] Inventors: Yoshinari Kozuka; Yuichi Kakizaki, both of Nagoya, Japan

[73] Assignee: NGK Insulators, Ltd., Japan

[21] Appl. No.: 550,978

[22] Filed: Jul. 11, 1990

[30] Foreign Application Priority Data

Jul. 12, 1989 [JP] Japan .................................. 1-179855
Jul. 12, 1989 [JP] Japan .................................. 1-179856

[51] Int. Cl.$^5$ ............................................. G01R 19/00
[52] U.S. Cl. ...................................... 324/96; 324/72.5; 324/244.1
[58] Field of Search ................. 324/96, 72.5, 72, 244, 324/244.1; 350/375-378, 96.29; 250/227.17

[56] References Cited

U.S. PATENT DOCUMENTS

| | | | |
|---|---|---|---|
| 4,531,092 | 7/1985 | Shibano | 324/244.1 |
| 4,547,729 | 10/1985 | Adolfson et al. | 324/96 |
| 4,563,646 | 1/1986 | Desormiere | 324/244.1 |
| 4,631,402 | 12/1986 | Nagatsuma | 324/96 |
| 4,956,607 | 9/1990 | Abe et al. | 324/96 |

Primary Examiner—Kenneth A. Wieder
Assistant Examiner—William J. Burns
Attorney, Agent, or Firm—Parkhurst, Wendel & Rossi

[57] ABSTRACT

A method for optically measuring an AC electric field or an AC voltage is disclosed. According to the method, a light beam emitted from a light-emitting portion is transmitted through a sensing head including a Pockel's-effect element while an AC electric field to be measured is applied to the Pockel's-effect element, so that the light beam is modulated by the applied AC electric field. The transmitted light beam is then received by a light-detecting portion, while in turn produces an electric signal corresponding to the received light beam. From the electric signal are selected a first component ($E\omega$) having a same angular frequency as that of the AC electric field, and a second component ($E_2\omega$) having an angular frequency which is two times that of the AC electric field. Then, a ratio ($E_2\omega/E\omega$) of the second component to the first component is calculated so as to determine a strength of the AC electric field or a magnitude of the AC voltage which produces the AC electric field, based on the ratio ($E_2\omega E/\omega$).

4 Claims, 4 Drawing Sheets

METHOD FOR OPTICALLY MEASURING ELECTRIC FIELD AND OPTICAL VOLTAGE/ELECTRIC-FIELD SENSOR

BACKGROUND OF THE INVENTION

1. Field of the Invention

The present invention relates in general to a method for optically measuring an AC electric field or an AC voltage which produces the AC electric field, by utilizing a beam of light as a medium for the measurement and the Pockel's effect for modulating the light beam. The invention is also concerned with an optical voltage/electric-field sensor adapted to measure an AC electric field or voltage according to the above method.

2. Discussion of the Prior Art

In recent years, optical measurement utilizing modulation of light by the Pockel's effect has been drawing growing attention of the industries concerned with the art of power transmission and distribution, for measuring or determining an AC electric field strength or a voltage associated with power transmission and distribution lines. Such optical measurement utilizes a beam of light as a medium having high degrees of insulation and freedom from electromagnetic induction noises.

Conventional optical sensors for measuring the AC electric field (voltage) by utilizing the Pockel's effect have a light-emitting portion for emitting a light beam for the measurement, a sensing head having a polarizer, a Pockel's-effect element, and an analyzer which are disposed in series with each other, and a light-detecting portion for receiving the light beam emitted from the light-emitting portion and transmitted through the sensing head. The polarizer and the analyzer of the sensing head are respectively located upstream and downstream of the Pockel's-effect element in the direction of propagation of the light beam. According to this known optical measuring method, the light beam emitted by the light-emitting portion is modulated by an AC electric field applied to the Pockel's-effect element while being transmitted through the sensing head. The transmitted light beam is received by the light-detecting portion which produces an electric signal corresponding to the received light beam. From the electric signal are retrieved or selected a DC component ($E_{dc}$), and a signal component ($E\omega$) having the same angular frequency as that of the AC electric field applied to the Pockel's-effect element. Such an optical sensor is capable of determining the AC electric field applied to the Pockel's-effect element, or the AC voltage producing the AC electric field, based on the ratio ($E\omega/E_{dc}$) of the signal component to the DC component.

The known optical measuring method as described above accurately works when optical fibers or other suitable guiding means are used so that the light-detecting portion receives only the measuring light beam which has been emitted from the light-emitting portion. However, where there exists background or ambient light, such as sunlight or illuminating light, in the optical path of the measuring light beam, the light-detecting portion may undesirably receive the ambient light in the optical path, together with the measuring light beam originating from the light-emitting portion, thereby causing errors in the measurement of the AC electric field (voltage).

The conventional optical electric-field sensor as described above is adapted to determine or calculate a strength of the AC electric field, based on the ratio ($E\omega/E_{dc}$) of the signal component ($E\omega$) and the DC component ($E_{dc}$) which are both selected from the output signal of the light-detecting portion. As is apparent from the equation (10) which will be described later, the equation which is representative of the ratio ($E\omega/E_{dc}$) includes, for example, a half-wave voltage $V\pi$ of the Pockel's-effect element, which has dependence on the ambient temperature of that element. Therefore, the conventional optical sensor suffers from measurement errors caused by the ambient temperature at the Pockel's-effect element. While various methods have been proposed for improved measuring accuracy, there has not been found any practically effective solution to this problem. That is, the sensors which have been proposed to solve the problem are likely to be large-sized and complicated in construction, and are therefore unsuitable for practical use.

SUMMARY OF THE INVENTION

The present invention was developed in view of the above situation in the prior art. It is therefore a first object of the present invention to provide a method for optically measuring an AC electric field, which can provide highly accurate and reliable measurement results that are not influenced by ambient light possibly present in an optical path of a measuring light beam.

A second object of the invention is to provide such a method that is effective to reduce errors in the measurement due to changes of the ambient temperature at a Pockel's-effect element, thereby steadily assuring highly accurate measurement of the AC electric field.

A third object of the invention is to provide an optical voltage/electric-field sensor which is suitable for carrying out the method as described above.

The first object may be achieved according to one aspect of the present invention, which provides a method for optically measuring an AC electric field or an AC voltage, which comprises the steps of (a) emitting a light beam from a light-emitting portion, (b) transmitting the light beam emitted by the light-emitting portion through a sensing head including a Pockel's-effect element while applying an AC electric field to be measured to the Pockel's-effect element, so that the light beam is modulated by the AC electric field applied to the Pockel's-effect element, the sensing head further including a polarizer and an analyzer respectively disposed upstream and downstream of the Pockel's-effect element in the direction of transmission of the light beam, (c) directing the light beam transmitted through the sensing head, to be received by a light-detecting portion, so that the light-detecting portion produces an electric signal corresponding to the received light beam, (d) selecting a first componen-t ($E\omega$) of the electric signal which has a same angular frequency as that of the AC electric field, and a second component ($E_{2\omega}$) which has an angular frequency which is two times that of the AC electric field, and (e) calculating a ratio ($E_{2\omega}/E\omega$) of the second component to the first component, to determine a strength of the AC electric field, or a magnitude of the AC voltage which produces the AC electric field based on the ratio ($E_{2\omega}/E\omega$).

According to the method of the invention as described above, it is possible to obtain considerably reliable measurement results, which are less likely to be influenced by ambient light possibly present in the optical path of the measuring light beam emitted from the light-emitting portion.

The second object indicated above may be attained according to one form of the above aspect of the present invention, in which a retardation element is disposed in series with the Pockel's-effect element, between the polarizer and the analyzer. The retardation element gives an optical bias c which satisfies the following equation:

$$V\pi_0 \cdot \frac{d(1/V\pi)}{dT} \cdot \sin 2\psi_0 - 2\frac{d\psi}{dT} \leq 1 \times 10^{-4}$$

where, $V_f$: half-wave voltage of said Pockel's-effect element $V\pi_0$: half-wave voltage of said Pockel's-effect element at the room temperature $\frac{d(1/V\pi)}{dT}$ : temperature coefficient of the half-wave voltage $\psi_0$: optical bias given by said retardation element at the room temperature $\frac{d\psi}{dT}$ : temperature coefficient of the optical bias.

The above form of the invention is effective to reduce measurement errors caused by changes of the ambient temperature at the Pockel's-effect element. In this arrangement, the calculated ratio of the second component to the first component is not influenced by the varying ambient temperature and the chronological changes of the sensor components such as the light-emitting and light-detecting portions.

The second object may also be attained according to another aspect of the invention, whilch provides a method for optically measuring an AC electric field or an AC voltage, comprising the steps of (a) emitting a light beam from a light-emitting portion, (b) transmitting the light beam emitted by the light-emitting portion through a sensing head including a Pockel's-effect element while applying an AC electric field to be measured to the Pockel's-effect element, so that the light beam is modulated by the AC electric field applied to the Pockel's-effect element, the sensing head further including a polarizer and an analyzer respectively disposed upstream and downstream of the Pockel's-effect element in the direction of transmission of the light beam, (c) applying a predetermined strength of DC electric field to the Pockel's-effect element while the light beam is transmitted through the Pockel's-effect element, (d) directing the light beam transmitted through the sensing head, to be received by a light-detecting portion, so that the light-detecting portion produces an electric signal corresponding to the received light beam, (e) selecting a first component ($E\omega$) of the electric signal which has a same angular frequency as that of the AC electric field, and a second component ($E_2\omega$) which has an angular frequency which is two times that of the AC electric field, and (f) controlling an intensity of the light beam to be emitted from the light-emitting portion, so that the first component ($E\omega$) is held constant.

The third object may be accomplished according to a further aspect of the present invention, which provides an optical voltage/electric-field sensor comprising (a) a light-emitting portion for emitting a light beam, (b) a sensing head including a Pockel's-effect element having the Pockel's effect, a polarizer disposed between the light-emitting portion and the Pockel's-effect element to receive the light beam. and an analyzer receiving the light beam transmitted through the polarizer and the Pockel's-effect element, the light beam being modulated by an AC electric field applied to the Pockel's-effect element, (c) a light-detecting portion receiving the light beam transmitted through the sensing head and producing an electric signal corresponding to the received light beam, (d) first-component selecting means for selecting a first component ($E_2\omega$) of the electric signal which has a same angular frequency of the AC electric field, (e) second-component selecting means for selecting a second component ($E_2\omega$) of the electric signal which has an angular frequency which is two times that of the AC electric field; and (f) ratio calculating means for calculating a ratio ($E_2\omega/E\omega$) of the second component to the first component, to determine the AC electric field based on the ratio ($E_2\omega/E\omega$) calculated by the ratio calculating means.

The third object indicated above may also be attained according to a still further aspect of the invention, which provides an optical voltage/electric-field sensor comprising (a) a light-emitting portion for emitting a light beam, (b) a sensing head including a Pockel's-effect element having a Pockel's effect, a polarizer disposed between the light-emitting portion and the Pockel's-effect element to receive the light beam, and an analyzer receiving the light beam transmitted through the polarizer and the Pockel's-effect element, the light beam being modulated by an AC electric field applied to the Pockel's-effect element, (c) means for applying a predetermined strength of DC electric field to the Pockel's-effect element, (d) a light-detecting portion receiving the light beam transmitted through the sensing head and producing an electric signal corresponding to the received light beam, (e) first-component selecting means for selecting a first component ($E\omega$) of the electric signal which has a same angular frequency of the AC clectric field, (f) second-component selecting means for selecting a second component ($E_2\omega$) of the electric signal which has an angular frequency which is two times that of the AC electric field, and (g) feedback control means for controlling an intensity of the light beam to be emitted from the light-emitting portion, so that the first component ($E\omega$) selected by the first-component selecting means is held constant.

BRIEF DESCRIPTION OF THE DRAWINGS

The above and optional objects, features and advantages of the present invention will be better understood by reading the following detailed description of some presently preferred embodiments of this invention, when considered in connection with the accompanying drawings, in which.

DETAILED DESCRIPTION OF THE PREFERRED EMBODIMENTS

Figure 1:
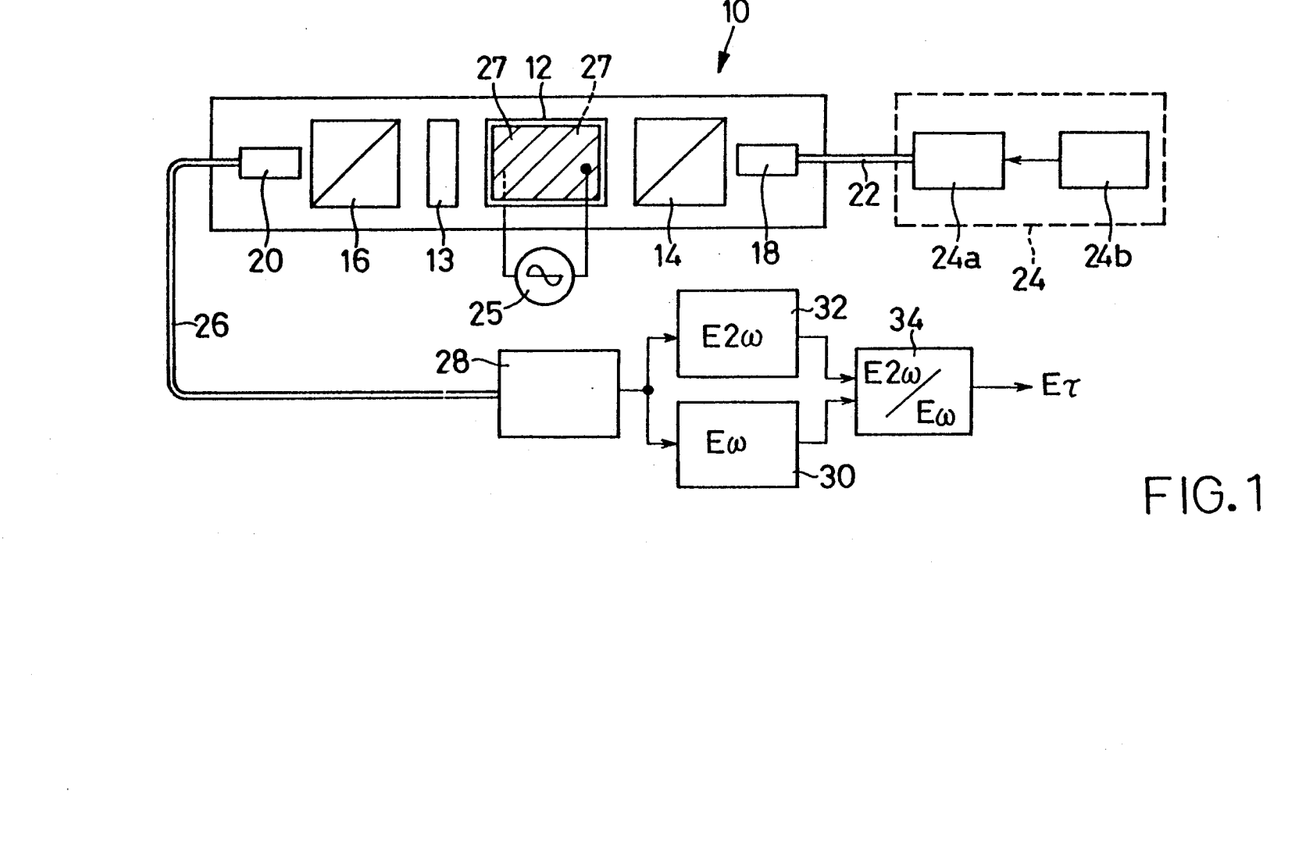
FIGS. 1 through 4 are schematic views showing different forms of optical voltage/electric-field sensors of the invention.

Referring first to FIG. 1, there is shown an optical voltage/electric-field sensor which is capable of determining an electric field strength or a voltage producing the electric field, by utilizing the Pockel's effect.

In FIG. 1, reference numeral 10 denotes a sensing head portion of the sensor, which incorporates a Pockel's-effect element 12 and a retardation element 13 disposed in series such that the Pockel's-effect element 12 is upstream of the retardation element 13 in the direction of propagation of a measuring light beam through the sensing head portion 10. A polarizer 14 and an analyzer 16 are disposed on opposite sides of a series of the elements 12 and 13 as viewed in the direction of the light propagation such that the polarizer 14 is adjacent to the Pockel's-effect element 12 while the analyzer 16 is adjacent to the retardation element 13. The sensing head portion 10 further incorporates fiber collimators 18, 20 disposed in series with the components indicated above such that the fiber collimator 18 is upstream of the polarizer 14 while the fiber collimator 20 is downstream of the analyzer 16 in the direction of propagation of the light beam. The sensor has a light-emitting portion 24 for producing the measuring light beam, which includes a light-emitting element 24a and a driver circuit 24b for driving the light-emitting element 24a. The light beam emitted from the light-emitting element 24a is directed to the fiber collimator 18 through an incoming optical fiber 22, and is incident upon the sensing head portion 10, for transmission through the polarizer 14, Pockel's-effect element 12, retardation element 13 and analyzer 16 in the order of description. The light beam emitted from the analyzer 16 is incident upon the fiber collimator 20 and is emitted therefrom.

The Pockel's-effect element 12 may be formed of a material such as $LiNbO_3$, $LiTaO_3$, $Bi_{12}SiO_{20}$, $Bi_{12}GeO_{20}$, CdMnTe, which has the Pockel's effect. The retardation element 13 may be formed of a birefringent material such as rock crystal, $Bi_{12}SiO_{20}$, $Bi_{12}GeO_{20}$, which is capable of effecting birefringence of a light beam or doubly refracting a light beam.

The Pockel's-effect element 12 has a pair of electrodes 27, 27 formed on its opposite faces which are opposed to each other in a direction perpendicular to the direction of propagation of the light beam through the sensing head portion 10. Reference numeral 25 denotes AC voltage applying means in the form of an AC voltage applying device. The AC voltage applying device 25 is electrically connected to the electrodes 27, 27 through respective lead wires, so that an AC voltage V is applied between the electrodes 27.

The output light beam emitted from the sensing head portion 14 through the fiber collimator 20 is directed to a light-detecting portion 28 of the sensor, through an outgoing optical fiber 26 which is optically coupled to the fiber collimator 20. The light-detecting portion 28, which may consist of a photodiode, converts the received light beam into an electric signal E corresponding to an intensity P of the light beam. The electric signal E is applied to first-component selecting means in the form of a first component detector 30, and to second-component selecting means in the form of a second component detector 32.

The first component detector 30 is constituted by an electric filter, a phase detecting circuit or other suitable means, and is adapted to select or retrieve the first component $E\omega$ of the electric signal E which has the same angular frequency $\omega$ as that of the AC voltage V applied to the Pockel's-effect element 12 by means of the AC voltage applying device 25. On the other hand, the second component detector 32 is constituted by suitable means similar to the detector 30, and is adapted to select or retrieve the second component $E_{2\omega}$ of the electric signal E which has the angular frequency $2\omega$ which is two times that of the applied AC voltage V. The first and second components $E\omega$ and $E_{2\omega}$ selected by the respective first and second component detectors 30, 32 are both applied to ratio calculating means in the form of a divider 34. This divider 34 is adapted to divide the second component $E_{2\omega}$ received from the second component detector 32 by the first component $E\omega$ received from the first component detector 30, so as to obtain a ratio $E\tau$ ($E_{2\omega}/E\omega$) of these components $E\omega$, $E_{2\omega}$. In the instant embodiment, the magnitude of the applied AC voltage V can be determined based on the output $E\tau$ of the divider 34.

There will be described the operating principle of the instant sensor to determine the AC voltage V.

In the optical voltage/electric-field sensor as described above, the light beam emitted from the light-emitting portion 24 is transmitted through the Pockel's-effect element 12 to which the AC voltage V to be measured is applied from the AC voltage applying device 25, so that the transmitted light beam undergoes optical retardation $\phi$. The amount of this retardation $\phi$ where the relative angular difference $\theta$ between the polarizer 14 and the analyzer 16 is 0° is represented by the following equation (1):

$$\phi = (\pi/V\pi) \cdot V \tag{1}$$

where, $V\pi$: half-wave voltage of the Pockel's-effect element 12

Since the light beam which is incident upon the light-detecting portion 28 consists only of the light beam originating from the light-emitting portion 24 in this embodiment, the intensity P of the light beam received by the light-detectign portion 28 is represented by the following equation (2), and the electric signal E produced by the light-detectign portion 28 and corresponding to the light beam intensity P is represented by the following equation (3):

$$\begin{aligned} P &= cP_0 \cos^2\{(\phi + \psi)/2\} \\ &= cP_0 \cos^2[\{(\pi/V\pi)V + \psi\}/2] \\ &= \frac{cP_0}{2}[1 + \cos\{(\pi/V\pi)V + \psi\}] \\ &= \frac{cP_0}{2}[1 + \cos\{(\pi/V\pi)V_0\sin\omega t + \psi\}] \\ &= \frac{cP_0}{2}\{1 + \cos(A\sin\omega t + \psi)\} \end{aligned} \tag{2}$$

where,
c: proportion constant
$P_0$: intensity of the light beam emitted from the light-emitting portion 24
$\psi$: optical bias given by the retardation element 13
$V_0$: amplitude of the applied AC voltage (V)
$\omega$: angular frequency of the applied AC voltage (V)
t: time $$A = (\pi/V\pi) \cdot V_0$$

$$E = \frac{E_0}{2}\{1 + \cos(A\sin\omega t + \psi)\} \tag{3}$$

where, $E_0$: amplitude of the electric signal (E)

The above equation (3) representing the electric signal E received from the light-detecting portion 28 is expanded into the following equation (4), by using the Bessel function. Therefore, the first and second components $E\omega$ and $E_{2\omega}$ of the electric signal E, which are selected by the respective first and second component detectors 30, 32, are represented by the following equations (5) and (6), respectively:

$$E = \frac{E_0}{2} \{1 + \cos(A\sin\omega t + \psi)\} \quad (4)$$

$$= \frac{E_0}{2} \{1 + \cos(A\sin\omega t) \cdot \cos\psi - \sin(A\sin\omega t) \cdot \sin\psi\}$$

$$= \frac{E_0}{2} [1 + \{J_0(A) + 2J_2(A)\sin2\omega t + 2J_4(A)\sin4\omega t + \dots\}\cos\psi - \{2J_1(A)\sin\omega t + 2J_3(A)\sin3\omega t + \dots\}\sin\psi]$$

$$E\omega = -E_0 \cdot J_1(A) \cdot \sin\psi \quad (5)$$

$$E_{2\omega} = E_0 \cdot J_2(A) \cdot \cos\psi \quad (6)$$

The first and second components $E\omega$ and $E_{2\omega}$ of the electric signal E are then applied to the divider 36, so that the ratio $E\tau$ of the second component $E_{2\omega}$ to the first component $E\omega$ is calculated by the divider 36 according to the following equation (7):

$$E\tau = \left| \frac{E_{2\omega}}{E\omega} \right| \quad (7)$$

$$= \frac{E_0 \cdot J_2(A) \cdot \cos\psi}{E_0 \cdot J_1(A) \cdot \sin\psi}$$

$$= \frac{\frac{A^2}{8}\left(1 - \frac{A^2}{12}\right)\cos\psi}{\frac{A}{2}\left(1 - \frac{A^2}{8}\right)\sin\psi}$$

$$= \frac{A}{4}\left(1 + \frac{A^2}{24}\right)\cot\psi$$

Where the value $A\{=(\pi/V\pi \cdot V_0)\}$ is smaller than 1, the above equation (7) is rewritten into the following equation (8):

$$E\tau = \frac{A}{4}\left(1 + \frac{A^2}{24}\right)\cot\psi \quad (8)$$

$$\approx \frac{A}{4}\cot\psi$$

$$= \frac{\pi/V\pi \cdot V_0}{4}\cot\psi$$

$$= \frac{\pi/V\pi \cdot \cot\psi}{4} V_0$$

It will be understood from the above equation (8) that the ratio $E\tau$ obtained by the divider 34 is proportional to the amplitude $V_0$ of the applied AC voltage V. Accordingly, the instant sensor as shown in FIG. 1 is capable of determining the amplitude $V_0$ of the AC voltage V applied to the Pockel's-effect element 12 to thereby determine the strength of the electric field applied to the element 12, based on the output $E\tau$ of the divider 34, in the manner similar to that of the conventional optical electric-field sensor as described above. In the conventional sensor, the DC component (Edc) and the component ($E\omega$) having the same angular frequency $\omega$ as that of the applied AC voltage (V) are retrieved from the output (E) of the light-detecting portion (28), so that the amplitude $V_0$ of the applied AC voltage V is determined based on the ratio ($E\omega$/Edc) of the component ($E\omega$) to the DC component (Edc).

Figure 2:
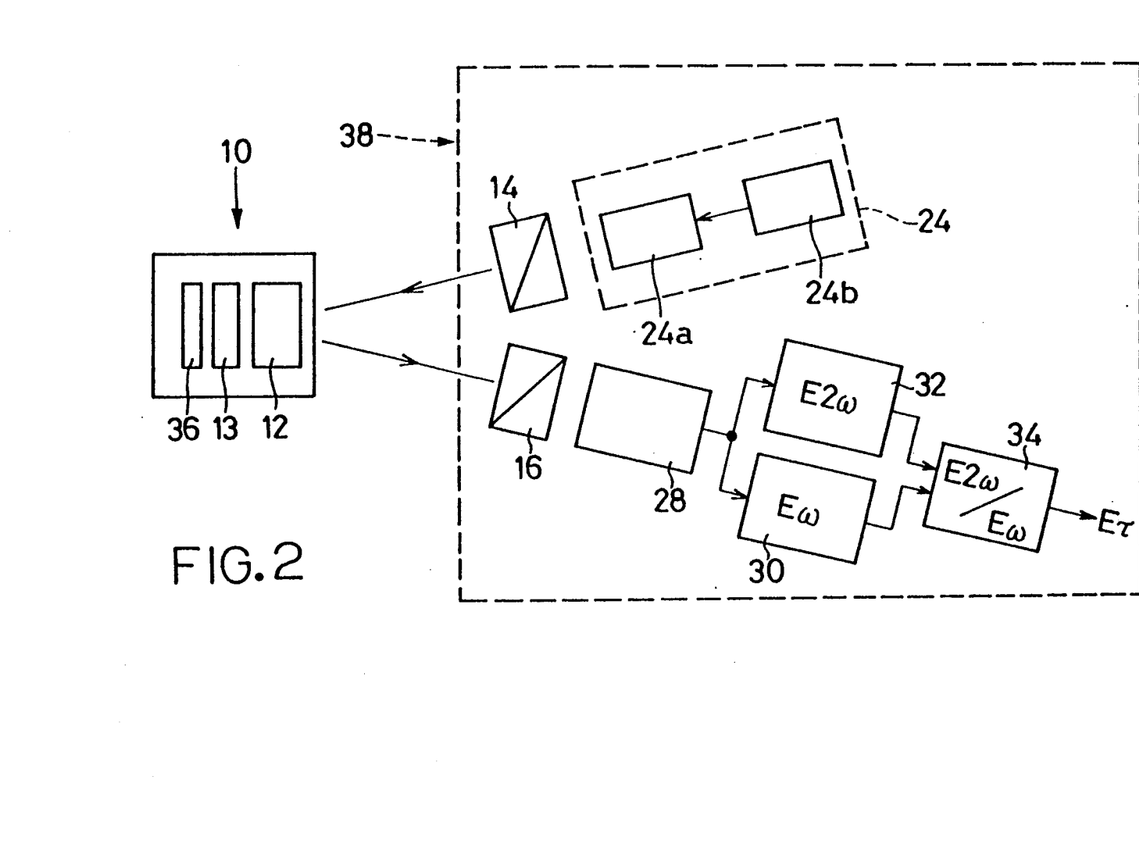

It will be apparent from the above equation (8) that the output $E\tau$ of the divider 34 does not include the amplitude $E_0$ of the electric signal E, which changes with the amount of the light beam emitted from the light-emitting portion 24, transmission loss in the optical path of the light beam, or sensitivity of the light-detecting portion 28. Therefore, the instant voltage/electric-field sensor is free from measurement errors caused by changes in the amount of the light beam emitted by the light-emitting portion 24, the transmission loss in the optical path of the light beam, and the sensitivity of the light-detecting portion 28. The instant voltage/electric-field sensor is adapted such that only the light beam emitted from the light-emitting portion 24 is transmitted through the polarizer 14, Pockel's-effect element 12, retardation element 13, and analyzer 16 of the sensing head portion 10, and such that only the light beam transmitted through the sensing head portion 10 is received by the light-detecting portion 28. Accordingly, the intensity P of the light beam received by the light-detecting portion 28 is represented by the above-indicated equation (2), and the electric signal E produced by the light-detecting portion 28 is represented by the above-indicated equation (3). However, where there exists ambient light in the optical path of the light beam as in a sensor as shown in FIG. 2, that is, where at least a part of the optical path of the light beam lies in an outdoor space or an illuminated room, the intensity P of the light beam received by the light-detecting portion 28 is influenced by the ambient light present in the optical path, and is therefore represented by the following equation (2)'. In this case, the electric signal E produced by the light-detecting portion 28 is accordingly represented by the following equation (3)':

$$P = \frac{cP_0}{2}\{1 + \cos(A\sin\omega t + \psi)\} + Pb \quad (2)'$$

where,
Pb: intensity of the ambient light received by the light-detecting portion 28

$$E = \frac{E_0}{2}\{1 + \cos(A\sin\omega t + \psi)\} + Eb \quad (3)'$$

where,
Eb: electric signal corresponding to the intensity (Pb) of the ambient light Since the electric signal Eb corresponding to the intensity Pb of the ambient light is considered as a DC component of the signal E, the above equation (3)' is expanded into the following equation (4)' by using the Bessel function:

$$E = Eb + \frac{E_0}{2}[1 + \{J_0(A) + 2J_2(A)\sin2\omega t + 2J_4(A)\sin4\omega t + \dots\}\cos\psi - \{2J_1(A)\sin\omega t + 2J_3(A)\sin3\omega t + \dots\}\sin\psi] \quad (4)'$$

It will be apparent from the above equation (4)' that the first component $E\omega$ which is detected by the first component detector 30 and which has the same angular frequency $\omega$ as that of the AC voltage V is represented by the above-indicated equation (5), while the second component $E_{2\omega}$, which is detected by the second component detector 32 and which has the angular frequency $2\omega$ which is two times that of the applied AC voltage V is represented by the above-indicated equation (6), as in the preceding embodiment of FIG. 1. Accordingly, the output $E_T$ ($E_{2\omega}$, $E_\omega$) of the divider 34 is represented by the above-indicated equation (8) which does not include the electric signal Eb corresponding to the intensity Pb of the ambient light.

When the ambient light is present in the optical path of the measuring light beam emitted from the light-emitting portion 24, the light-detecting portion 28 is likely to receive the ambient light as well as the measuring light beam. Even in this case, the ambient light in the optical path has no influence on the results of the measurement of the AC voltage V (amplitude $V_0$). Thus, the instant optical sensor is free from measurement errors caused by the ambient light, assuring comparatively high measuring accuracy.

In the conventional optical voltage/electric-field sensor in which a light beam for measurement is transmitted through a space exposed to the ambient light, the DC component Edc of the electric signal E produced by the light-detecting portion 28 is represented by the following equation (9), and the component $E\omega$ having the same angular frequency $\omega$ as that of the applied AC voltage V is represented by the following equation (5)', where the optical bias $\psi$ given by the retardation element 13 is equal to 90°. Therefore, the ratio $E\omega/Edc$ of these components is represented by the following equation (10), which includes the electric signal Eb corresponding to the intensity Pb. It follows that the conventional optical sensor for determining the AC voltage V ($V_0$) suffers from measurement errors caused by the ambient light existing in the optical path of the measuring light beam.

$$Edc = Eb + \frac{E_0}{2} \quad (9)$$

$$E\omega = E_0 \cdot J_1(A) \cdot \sin\omega t \quad (5)'$$

$$\frac{E\omega}{Edc} = \frac{E_0/2 \cdot A\sin\omega t}{Eb + E_0/2} \quad (10)$$

$$= \frac{E_0/2 \cdot (\pi/V\pi) \cdot V_0 \cdot \sin\omega t}{Eb + E_0/2}$$

In the optical voltage/electric-field sensor as shown in FIG. 2, the sensing head portion 10 includes the Pockel's-effect element 12 and the retardation element 13 which are disposed in series in the direction of propagation of the measuring light beam. The sensing head portion 10 further includes a reflecting mirror 36 disposed on one of the opposite sides of the retardation element 13 remote from the Pockel's-effect element 12. Namely, the sensing head portion 10 consists of the elements 12, 13 and the mirror 36 which are arranged in series in the direction of propagation in the order of description. On the other hand, the polarizer 14 and the analyzer 16 are accommodated within a body 38 of the sensor which incorporates the light-emitting portion 24 and the light-detecting portion 28, such that the polarizer 14 is adjacent to the light-emitting portion 24 while the analyzer 16 is adjacent to the light-detecting portion 28. It will be apparent from FIG. 2 that the light beam emitted from the light-emitting element 24a of the portion 24 is transmitted through the polarizer 14, Pockel's-effect element 12 and retardation element 13 in the order of description, and then reflected by the reflecting mirror 36. Thereafter, the reflected light beam is again transmitted through the retardation element 13 and the Pockel's-effect element 12, and is incident upon the light-detecting portion 28 through the analyzer 16.

Suppose the optical voltage/electric-field sensor as shown in FIG. 1 is adapted such that the optical bias $\psi$ given by the retardation element 13 is determined so as to satisfy the following equation (11). In this case, the optical sensor is able to determine the applied AC voltage V or its amplitude $V_0$ constantly with high accuracy, irrespective of variation of the ambient temperature of the Pockel's-effect element 12.

$$V\pi_0 \cdot \frac{d(1/V\pi)}{dT} \cdot \sin 2\psi_0 = 2\frac{d\psi}{dT} \quad (11)$$

where, $\frac{d(1/V\pi)}{dT}$ : temperature coefficient of the half-wave voltage ($V\pi$)

$\psi_0$: optical bias given by the retardation element 13 at the room temperature $\frac{dC}{dT}$ : temperature coefficient of the optical bias $\psi$ It follows that the optical bias $\psi$ given by the retardation element 13 and the value A $\}=(\pi/V\pi)\cdot V_o\}$ which corresponds to the optical retardation $\phi$ by the Pockel's-effect element 12 are represented by the following equations (12) and (13), respectively, when the temperature dependence of these values $\psi$ and A is taken into consideration:

$$\psi = \psi_0 + \frac{d\psi}{dT} \cdot \Delta T \quad (12)$$
$$= \psi_0 + \Delta\psi$$

where, $\Delta T$: change in the ambient temperature $\psi_0$: optical bias given by the retardation element 13 at the room temperature $$\Delta\psi = \frac{d\psi}{dT} \cdot \Delta T$$

$$A = A_0 + \frac{dA}{dT} \cdot \Delta T \quad (13)$$
$$= A_0 + \Delta A$$

where, $A_0 = (\pi/V\pi_0) \cdot Vhd\ 0$ $V\pi_0$: half-wave voltage of the Pockel's-effect element 12 at the room temperature $$\Delta A = \frac{dA}{dT} \cdot \Delta T$$

Consequently, the following equation (14) is derived from the above-indicated equation (8) which represents the ratio $E_T$ of the second component $E_{2\omega}$ having the angular frequency $2\omega$ which is two times that of the applied AC voltage V, to the first component $E\omega$ having the same angular frequency $\omega$ as that of the applied AC voltage, when the temperature dependence of the values $\psi$ and A is taken into consideration:

$$
\begin{aligned}
E_T &= \frac{E_{2\omega}}{E_\omega} \\
&= \frac{1}{4}(A_0 + \Delta A) \cdot \left(1 + \frac{A^2}{24}\right) \cdot \cot(\psi_0 + \Delta\psi) \\
&= \frac{1}{2}(A_0 + \Delta A) \cdot \left(1 + \frac{A^2}{24}\right) \cdot \cot\psi_0 \cdot \left(1 - \frac{2\Delta\psi}{\sin 2\psi_0}\right)
\end{aligned}
\quad (14)
$$

If $$\frac{2\Delta\psi}{\sin 2\psi_0}$$

is much smaller than 1, the above equation (14) is rewritten into the following equation (15):

$$
E_T = \frac{A_0}{2}\cot\psi_0 \left(1 + \frac{\Delta A}{A_0} - \frac{2\Delta\psi}{\sin 2\psi_0} + \frac{A^2}{24}\right)
\quad (15)
$$

If $$\frac{\Delta A}{A_0}$$

is equal to $$\frac{2\Delta\psi}{\sin 2\psi_0},$$

that is, if the the above-indicated equation (11) is met, the above equation (15) is rewritten into the following equation (16):

$$
E_T = \frac{A_0}{2}\cot\psi_0 \cdot \left(1 + \frac{A^2}{24}\right)
\quad (16)
$$

Since the nonlinear term ($A^2/24$) in the equation (16) is an extremely small value, and is substantially negligible, the above equation (16) which represents the output $E_T$ of the divider 34 is rewritten into the following equation (17):

$$
E_T = \frac{A_0}{2}\cot\psi_0 = \frac{\pi}{2V_{\pi 0}} \cdot \cot 2\psi_0 \cdot V_0
\quad (17)
$$

If the optical bias $\psi$ given by the retardation element 13 is determined so as to satisfy the above-indicated equation (11), the equation which represents the output $E_T$ of the divider 34 does not involve any substantial influence due to the ambient temperature of the Pockel's-effect element, as is apparent from the above equation (17). Accordingly, the optical voltage/electric-field sensor having the retardation element 13 which is disposed between the Pockel's-effect element 12 and the analyzer 16, and which gives the optical bias that satisfies the above equation (11), can provide stable measurement results which are free of errors caused by the varing ambient temperature of the Pockel's-effect element 12. Further, the optical sensor is considerably simple in construction.

Since it is extremely difficult in reality to thoroughly equalize the left and right sides of the above-indicated equation (11), the optical bias $\psi$ given by the retardation element 13 need not be determined so as to fully satisfy the equation (11). However, it is desirable to determine the optical bias $\psi$ of the retardation element 13 as to satisfy the following equation (11)', more preferably, the following equation (11)'', in order to minimize the errors in the measurement due to the variation of the ambient temperature. When the optical bias $\psi$ of the retardation element 13 is set to satisfy the following equations (11)' and (11)'', the errors due to the variation of the ambient temperature can be reduced to 1% or lower, and 0.1% or lower, respectively, when the optical sensor is used in an environment in which the difference between the highest and lowest temperatures is 100° C.:

$$
V_{\pi 0} \cdot \frac{d(1/V_\pi)}{dT} \cdot \sin 2\psi_0 - 2\frac{d\psi}{dT} \leq 1 \times 10^{-4}
\quad (11)'
$$

$$
V_{\pi 0} \cdot \frac{d(1/V_\pi)}{dT} \cdot \sin 2\psi_0 - 2\frac{d\psi}{dT} \leq 1 \times 10^{-5}
\quad (11)''
$$

When the retardation element 13 interposed between the Pockel's-effect element 12 and the analyzer 16 is adapted to give the optical bias $\psi$ which satisfies the above-indicated equation (11) (practically, the above equation (11)'), the instant optical voltage/electric-field sensor is able to determine the applied AC voltage with comparatively high accuracy, without suffering from or minimizing otherwise possible errors due to changes of the ambient temperature. Such highly accurate measurement may be achieved even if the same retardation element 13 is interposed between the polarizer 14 and the Pockel's-effect element 12, or even if a plurality of retardation elements are disposed in series between the polarizer 14 and the analyzer 16 so that the retardation elements cooperate with each other to give an optical bias $\psi$ which satisfies the equation (11).

In the arrangement as described above, the retardation element or elements giving the appropriate optical bias $\psi$ is/are provided between the polarizer 14 and the analyzer 16 so as to make compensation for the temperature-dependent characteristics of the Pockel's-effect element 12 and the retardation element 13. This arrangement is also applicable to the optical voltage/electric-field sensor as shown in FIG. 2 in which the ambient light is present in the optical path of the measuring light beam. In this case, the retardation element 13 should be disposed adjacent the Pockel's-effect element 12 so that these elements 12, 13 are placed under the same thermal condition.

The foregoing description has been concerned with the optical sensor in which the measuring light emitted from light-emitting element 24a has a specific wavelength. However, the concept of the present invention is applicable to an optical sensor in which a light-emitting element similar to the element 24a produces measuring light, such as white light, having a relatively wide spectrum of wavelengths. Such an optical sensor can provide the same effect as provided by the aforementioned sensor which utilizes the measuring light having a specific wavelength. Accordingly, the optical voltage/electric-field sensor of the invention may use not only a relatively expensive light source capable of emitting a monochromatic radiation, such as a light-emitting diode (LED) or a laser diode (LD), but also a relatively inexpensive light source capable of emitting a relatively large amount of white light. The use of the the white light permits the sensor to operate with improved measuring accuracy because of the relatively large amount of light emitted from the light-emitting element 24a, while reducing the cost of the sensor.

Figure 3:
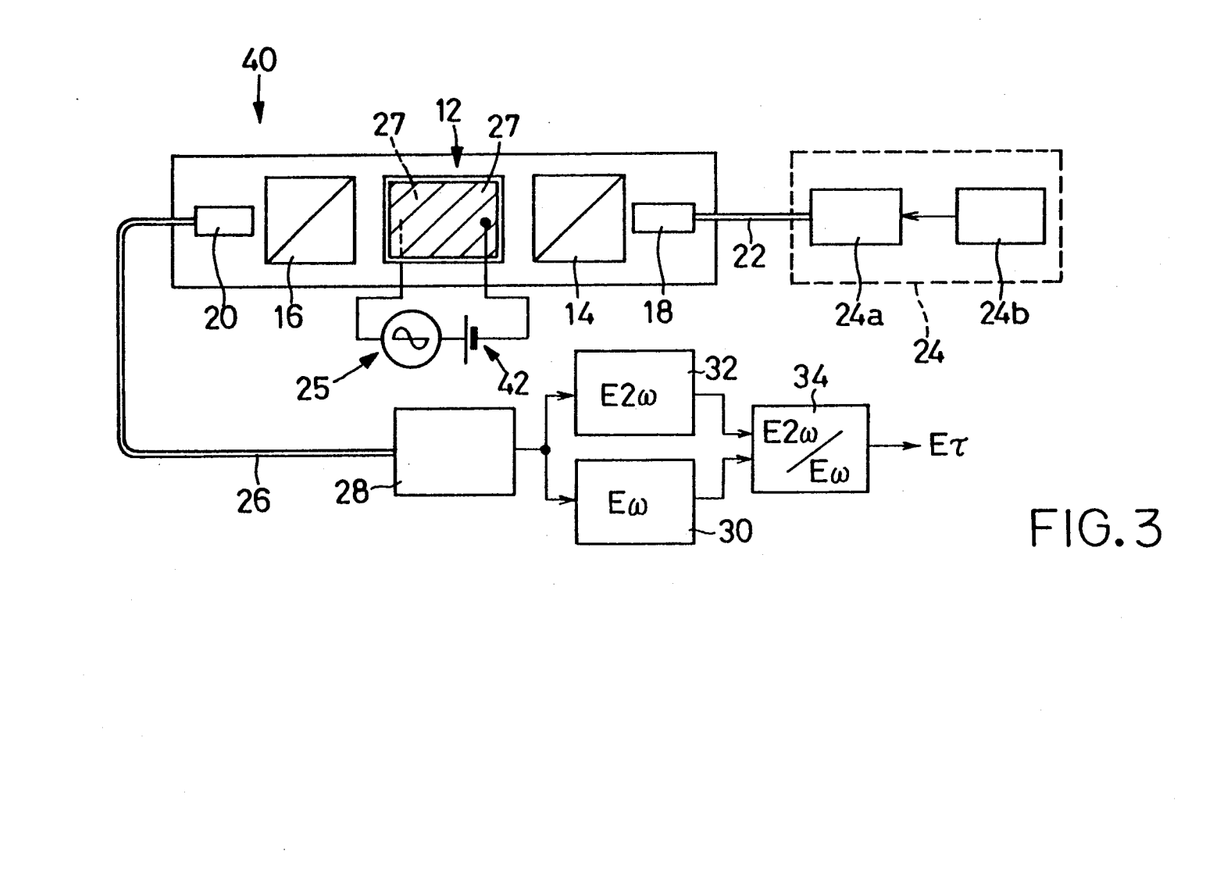

Referring next to FIG. 3, there is shown another embodiment of the invention in the form of an optical voltage/electric-field sensor having a sensing head portion 40. In FIG. 3, the same reference numerals as used in the preceding embodiments are used to identify functionally corresponding elements, and no redundant description of these elements will be provided.

The instant optical sensor is identical with the above-described sensor of FIG. 1 except that the sensing head portion 40 does not include the retardation element 13, and that the electrodes 27, 27 formed on the Pockel's-effect element 12 are electrically connected not only to the AC voltage applying device 25, but also to DC electric-field applying means in the form of a DC voltage applying device 42 connected in series with the AC voltage applying device 25. The AC voltage applying device 25 is adapted to apply an AC voltage V to the electrodes 27 while the DC voltage applying device is adapted to apply a DC voltage Vdc to the electrodes 27.

In this arrangement, a light beam emitted from the light-emitting element 24a of the light-emitting portion 24 is incident upon the sensing head portion 40 through the incoming optical fiber 22, and then is received by the light-detecting portion 28 through the outgoing optical fiber 26 as in the embodiment of FIG. 1. When the light beam incident upon the sensing head portion 40 is transmitted through the Pockel's-effect element 12, the light beam is modulated according to the AC and DC voltages (V, Vdc) applied to the Pockel's-effect element 12. That is, the light beam transmitted through the Pockel's-effect element 12 undergoes optical retardation $\phi$ caused by the applied AC voltage V, and optical bias $\psi$ given by the applied DC voltage Vdc. As a result, the intensity P of the light beam received by the light-detecting portion 28 where the relative angular difference $\theta$ between the polarizer 14 and the analyzer 16 is 0° is represented by the following equation (18):

$$P = cP_0\cos^2\{(\phi+\psi)/2\} \quad (18)$$

where, c: proportion constant $P_0$: intensity of the light beam emitted from the light-emitting element 24a Since the amount of this retardation $\phi$ is represented by the following equation (19), the above equation (18) is rewritten into the following equation (20):

$$\phi = (\pi/V\pi) \cdot V \quad (19)$$
$$= (\pi/V\pi) \cdot V_0 \cdot \sin\omega t$$

where, $V\pi$: half-wave voltage of the Pockel's-effect element 12

$V_0$: amplitude of the applied AC voltage (V)

$\omega$: angular frequency of the applied AC voltage (V)

$$P = cP_0\cos^2\{(\phi+\psi)/2\} \quad (20)$$
$$= cP_0\cos^2[\{(\pi/V\pi)\cdot V + \psi\}/2]$$
$$= \frac{cP_0}{2}[1 + \cos\{(\pi/V\pi)\cdot V_0\cdot\sin\omega t + \psi\}]$$

Consequently, the light-detecting portion 24 produces the electric signal E which is represented by the following equation (21):

$$E = \frac{E_0}{2}[1 + \cos\{(\pi/V\pi)\cdot V_0\cdot\sin\omega t + \psi\}] \quad (21)$$
$$= \frac{E_0}{2}\{1 + \cos(A\sin\omega t + \psi)\}$$

where, $E_0$: amplitude of the electric signal (E)

$$A = (\pi/V\pi)\cdot V_0$$

The above equation (21) may be expanded to the FIG. 1, by using the Bessel function. Accordingly, the first component $E\omega$ which is selected by the first component detector 30 and which has the same angular frequency $\omega$ as that of the applied AC voltage V is represented by the above-indicated equation (5), while the second component $E_{2\omega}$ which is selected by the second component detector 32 and which has the angular frequency $2\omega$ which is two times that of the applied AC voltage V is represented by the above-indicated equation (6). Consequently, the output $E\tau$ of the divider 34 is represented by the following equation (22):

$$E\tau = \left|\frac{E_{2\omega}}{E\omega}\right| \quad (22)$$
$$= \frac{J_2(A)\cdot\cos\psi}{J_1(A)\cdot\sin\psi}$$
$$= \frac{\frac{A^2}{8}\left(1-\frac{A^2}{12}\right)}{\frac{A}{2}\left(1-\frac{A^2}{8}\right)}\cdot\frac{1-\frac{\psi^2}{2}}{\psi\left(1-\frac{\psi^2}{6}\right)}$$
$$= \frac{A}{4\psi}\left(1+\frac{A^2}{24}-\frac{\psi^2}{3}\right)$$

When the AC voltage applying device 25 is controlled such that the value A $(=(\pi/V\pi)\cdot V_0)$ is 8.8° or lower, and the DC voltage applying device 42 is controlled such that the optical bias $\psi$ is not higher than 3.1°, the values $A^2/24$ and $\psi^2/3$ in the above equation (22) are both as small as 1/1000 or less. Further, the difference between the two values $A^2/24$ and $\psi^2/3$ can be further reduced by adjusting the DC voltage Vdc depending upon the AC voltage V to be measured. Accordingly, the above equation (22) may be approximated by the following equation (23):

$$\frac{E_{2\omega}}{E\omega} \approx \frac{A}{4\psi} \quad (23)$$

Since the value A is equal to $(\pi/V\pi)\cdot V_0$, and the value $\psi$ is equal to $(\pi/V\pi)\cdot Vdc$, the above equation (23) is represented by the following equation (24):

$$\frac{E_{2\omega}}{E_\omega} = \frac{(\pi/V\pi)V_0}{4(\pi/V\pi)Vdc} = \frac{V_0}{4Vdc} \tag{24}$$

It will be understood from the above equation (24) that the output $E\tau$ of the divider 34 is proportional to the amplitude $V_0$ of the AC voltage V applied from the AC voltage applying device 25 to the Pockel's-effect element 12. Accordingly, the amplitude $V_0$ of the AC voltage V applied to the Pockel's-effect element 12 can be determined based on the output $E\tau$ of the divider 34, and the strength of the electric field applied to the element 12 is determined based on the amplitude $V_0$ of the applied AC voltage V.

It will be also understood from the above equation (24) that the proportion constant of the AC voltage amplitude $V_0$ which is proportional to the ratio $E\tau$ includes only the DC voltage Vdc, and does not include the half-wave voltage $V\pi$ of the Pockel's-effect element 12 nor other variables which have dependence on the ambient temperature. Therefore, the output $E\tau$ of the divider 45 does not vary depending upon the variation of the ambient temperature at the position of the Pocke's-effect element 12, whereby the instant optical sensor can provide highly accurate measurement results which are free of errors due to the temperature variation.

As is apparent from the above equation (24), the output $E\tau$ of the divider 34 does not include the amplitude $E_0$ of the electric signal E which changes with the amount of the light emitted from the light-emitting portion 24, transmission loss in the optical path of the light beam and sensitivity of the light-detecting portion 28. Therefore, the output $E\tau$ of the divider 34 is not influenced by changes in the amount of the light emitted from the portion 24, the transmission loss and the sensitivity of the light-detecting portion 28. It follows that even if the amount of the light emitted by the light-emitting portion 24 and the sensitivity of the light-detecting portion 28 vary with chronological changes of the light-emitting element 24a and the light-detective element, the instant optical voltage/electric-field sensor is free from errors due to the changes as described above, in its measurement of the applied AC voltage V (amplitude $V_0$).

Figure 4:
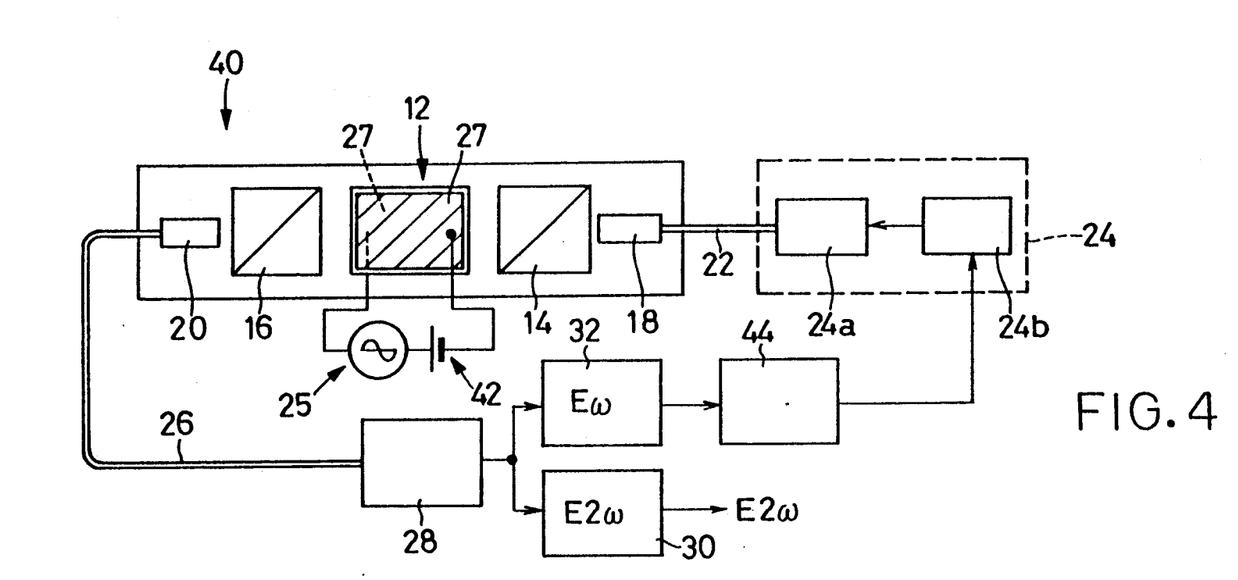

Referring next to FIG. 4, there is shown an optical voltage/electric-field sensor according to another embodiment of the present invention. This optcial sensor is provided with feedback control means in the form of a feedback control circuit 44, which is adapted to adjust the amount or intensity of the light emitted from the light-emitting element 24a, so that the first componetn $\omega$ of the electric signal E, which is selected by the first component detector 32, is held constant. More specifically, the driver circuit 24b of the light-emitting portion 24 is controlled by the feedback control circuit 44, based on the output (first component) $E\omega$ of the first component detector 32. As a result, the amount $P_0$ of the light emitted by the light-emitting element 24a is adjusted so that the first component $E\omega$ which has the same angular frequency $\omega$ as that of the applied AC voltage V is held at a constant value.

In this manner, the feedback control circuit 44 is adapted to detect the first component $E\omega$ selected by the first component detector 32, and control the amount $P_0$ of the light emitted from the light-emitting element 24a so that the value $E\omega$ as represented by the above-indicated equation (6) is held constant. In this arrangement, the second component $E_{2\omega}$ having the angular frequency which is two times that of the voltage V is detected while the amount $P_0$ of the emitted light is controlled by the feedback control circuit 44, and the amplitude $V_0$ of the applied AC voltage V is calculated based on the second component $E_{2\omega}$. The optical voltage/electric-field sensor constructed as described above can provide the same effect as provided by the sensor as shown in FIG. 3. Further, the instant optical sensor arrangement makes it possible to use a relatively simplified electronic circuit for measuring an AC voltage (electric field strength).

According to the present invention, it is possible to provide an optical electric-field (voltage) measuring technique which assures a stable operation of an optical sensor irrespective of the environmental changes and the chronological changes of the sensor components.

While the present invention has been described in its presently preferred embodiments, for illustrative purpose only, it is to be understood that the invention is not limited to the details of the embodiments, but may be embodied with various changes, modifications and improvements, which may occur to those skilled in the art, without departing from the spirit of the invention.

In the third and fourth embodiments, an exclusive power source may be used as a voltage source of the DC voltage applying device 42 which serves to apply a DC voltage to the Pockel's-effect element 12. Alternatively, an extremely small portion of the AC voltage to be measured may be rectified into a DC voltage to be supplied by the DC voltage applying device 42, since the amount of the DC voltage to be consumed by the device 42 is extremely small: In the case where the instant optical sensor is used for measuring an AC voltage associated with power transmission and distribution lines in the field of electric power transmission and distribution, a suitable amount of AC voltage may be retrieved from the power transmission and distribution lines by means of a current transformer (CT) or other suitable means, so as to be used as a voltage source for the DC voltage applying device 42.

What is claimed is:

1. A method for optically measuring an AC electric field or an AC voltage, comprising the steps of:

emitting a light beam from a light-emitting portion;

transmitting said light beam emitted by said light-emitting portion through a sensing head comprising a Pockel's-effect element while applying an AC electric field to be measured to said Pockel's-effect element, so that the light beam is modulated by said AC electric field applied to said Pockel's-effect element, said sensing head further comprising a polarizer and an analyzer respectively disposed upstream and downstream of said Pockel's-effect element in the direction of transmission of said light beam;

directing said light beam transmitted through said sensing head, to be received by a light-detecting portion, so that said light-detecting portion produces an electric signal corresponding to the received light beam;

selecting a first component ($E_\omega$) of said electric signal which has a same angular frequency as that of said AC electric field, and a second component ($E_{2\omega}$) which has an angular frequency which is two times that of said AC electric field;

calculating a ratio ($E_{2\omega}/E_\omega$) of said second component to said first component, to determine a strength of the AC electric field or a magnitude of the AC voltage which produces said AC electric field based on said ratio ($E_{2\omega}/E_\omega$); and providing a retardation element which is disposed in series with said Pockel's-effect element, between said polarizer and said analyzer, said retardation element giving an optical bias $\psi$ which satisfies the following equation:

$$V_{\pi 0} \cdot \frac{d(1/V_\pi)}{dT} \cdot \sin 2\psi_0 - 2\frac{d\psi}{dT} \leq 1 \times 10^{-4}$$

where, $V\pi$: half-wave voltage of said Pockel's-effect element
$V\pi_0$: half-wave voltage of said Pockel's-effect element at the room temperature $\frac{d(1/V\pi)}{dT}$ : temperature coefficient of the half-wave voltage $\psi_0$: optical bias given by said retardation element at the room temperature $\frac{d\psi}{dT}$ : temperature coefficient of the optical bias.

2. A method according to claim 1, wherein said light beam emitted by said light-emitting portion is transmitted through said Pockel's-effect element and said retardation element and is refelected by a reflecting mirror, the light beam reflected by said reflecting mirror being again transmitted through said retardation element and said Pockel's-effect element before the reflected light beam is incident upon said light-detecting portion.

3. An optical voltage/electric-field sensor comprising:
    a light-emitting portion for emitting a light beam;
    a sensing head comprising a Pockel's-effect element having a Pockel's-effect, a polarizer disposed between said light-emitting portion and said Pockel's-effect element to receive said light beam, and an analyzer receiving said light beam transmitted through said polarizer and said Pockel's-effect element, said light beam being modulated by an AC electric field applied to said Pockel's-effect element;
    a light-detecting portion receiving said light beam transmitted through said sensing head and producing an electric signal corresponding to the received light beam;
    first-component selecting means for selecting a first component ($E_\omega$) of said electric signal which has a same angular frequency of said AC electric field;
    second-component selecting means for selecting a second component ($E_{2\omega}$) of said electric signal which has an angular frequency which is two times that of said AC electric field; and
    ratio calculating means for calculating a ratio ($E_{2\omega}/E_\omega$) of said second component to said first component, to determine a strength of said AC electric field based on said ratio ($E_{2\omega}/E_\omega$) calculated by said ratio calculating means,
    said sensing head further comprising a retardation element which is disposed in series with said Pockel's-effect element, between said polarizer and said analyzer, said retardation element giving an optical bias $\omega$ which satisifes the following equation:

$$V_{\pi 0} \cdot \frac{d(1/V_\pi)}{dT} \cdot \sin 2\psi_0 - 2\frac{d\psi}{dT} \leq 1 \times 10^4$$

where, $V\pi$: half-wave voltage of said Pockel's-effect element
$V\pi_0$: half-wave voltage of said Pockel's-effect element at the room temperature $\frac{d(1/V\pi)}{dT}$ : temperature coefficient of the half-wave voltage $\psi_0$: optical bias given by said retardation element at the room temperature $\frac{d\psi}{dT}$ : temperature coefficient of the optical bias.

4. An optical voltage/electric-field sensor according to claim 3, wherein said sensing head further comprises a reflecting mirror for reflecting said light beam which has been transmitted through said Pockel's-effect element and said retardation element, such that the light beam reflected by said reflecting mirror is again transmitted through said retardation element and said Pockel's-effect element before the reflected light beam is incident upon said light-detecting portion.

* * * * *